United States Patent
Narducci et al.

(10) Patent No.: US 9,515,244 B2
(45) Date of Patent: Dec. 6, 2016

(54) SEEBECK/PELTIER THERMOELECTRIC CONVERSION ELEMENT WITH PARALLEL NANOWIRES OF CONDUCTOR OR SEMICONDUCTOR MATERIAL ORGANIZED IN ROWS AND COLUMNS THROUGH AN INSULATING BODY AND PROCESS

(71) Applicant: Consorzio Delta Ti Research, Milano Mi (IT)

(72) Inventors: Dario Narducci, Milan (IT); Gianfranco Cerofolini

(73) Assignee: Consorzio Delta Ti Research, Milan (IT)

(*) Notice: Subject to any disclaimer, the term of this patent is extended or adjusted under 35 U.S.C. 154(b) by 0 days.

(21) Appl. No.: 14/817,473

(22) Filed: Aug. 4, 2015

(65) Prior Publication Data

US 2015/0340583 A1    Nov. 26, 2015

Related U.S. Application Data (62) Division of application No. 13/516,067, filed as application No. PCT/EP2010/069531 on Dec. 13, 2010, now abandoned.

(30) Foreign Application Priority Data

Dec. 15, 2009   (IT) .......................... VA2009A000082

(51) Int. Cl.
  *H01L 35/28*  (2006.01)
  *H01L 35/04*  (2006.01)
  (Continued)

(52) U.S. Cl.
  CPC ............... *H01L 35/04* (2013.01); *H01L 27/16* (2013.01); *H01L 35/22* (2013.01); *H01L 35/32* (2013.01); *H01L 35/34* (2013.01)

(58) Field of Classification Search
  CPC .......... H01L 35/04; H01L 35/22; H01L 35/34; H01L 27/16; H01L 35/32
  (Continued)

(56) References Cited

U.S. PATENT DOCUMENTS 7,800,194 B2   9/2010  Freedman
8,907,323 B2   12/2014 Freedman
(Continued)

FOREIGN PATENT DOCUMENTS

IT   WO 2009125317 A2 * 10/2009 ............. H01L 35/32
WO   WO-03/046265 A2   6/2003
(Continued)

*Primary Examiner* — Luan Van
*Assistant Examiner* — Angelo Trivisonno
(74) *Attorney, Agent, or Firm* — Polsinelli PC (57) ABSTRACT

A novel and effective structure of a stackable element (A1, A2) or more generally adapted to be associated modularly to other similar elements to form a septum of relatively large dimensions for a Seebeck/Peltier thermoelectric conversion device, may be fabricated with common planar processing techniques. The structure basically consists of a stack (A1, A2) of alternated layers of a first dielectric material (2), adapted to be deposited in films of thickness lesser than or equal to about 50 nm, of low heat conductivity and which is etchable by a solution of a specific chemical compound, and of a second dielectric material (3) of low heat conductivity that is not etched by the solution. For the whole width, the stack is interrupted by parallel trenches (T1, T2, T3) the width (w) of which may correspond to the minimum linewidth of definition allowed by the resolution of the lithographic process used for defining the parallel trenches, but which may eventually be limited by other parameters, in primis the height of the stack (h) to be subjected to the vertical etch to cut the stack in order to form the parallel trenches.

6 Claims, 4 Drawing Sheets

(51) Int. Cl.
*H01L 35/22* (2006.01)
*H01L 27/16* (2006.01)
*H01L 35/32* (2006.01)
*H01L 35/34* (2006.01)

(58) Field of Classification Search
USPC .......................................................... 136/203
See application file for complete search history.

(56) References Cited

U.S. PATENT DOCUMENTS

2005/0072967 A1* 4/2005 Kornilovich ............. C25D 1/04
257/9
2008/0230110 A1 9/2008 Freedman

FOREIGN PATENT DOCUMENTS

WO WO-2009/125317 A2 10/2009
WO WO-2009/125317 A3 4/2010

* cited by examiner

SEEBECK/PELTIER THERMOELECTRIC CONVERSION ELEMENT WITH PARALLEL NANOWIRES OF CONDUCTOR OR SEMICONDUCTOR MATERIAL ORGANIZED IN ROWS AND COLUMNS THROUGH AN INSULATING BODY AND PROCESS

CROSS REFERENCE TO RELATED APPLICATIONS

This application is a Divisional of U.S. application Ser. No. 13/516,067 filed on Aug. 27, 2012, which is the National Phase filing under 35 U.S.C. §371 of PCT/EP2010/069531 filed on Dec. 13, 2010; and this application claims priority to Application No. VA2009A000082 filed in Italy on Dec. 15, 2009 under 35 U.S.C. §119; the entire contents of each application is hereby incorporated by reference.

BACKGROUND

Field of the Invention

The present disclosure relates in general to Seebeck/Peltier thermoelectric conversion devices and in particular to devices utilizing parallel nanowires of conductor or semiconductor material extending across an insulating septum.

General Notions

The Seebeck effect is a thermoelectric phenomenon whereby in elongated conductors or semiconductors, a temperature difference between portions thereof generates electricity. The effect, discovered by the physicist Thomas J. Seebeck in 1821, manifests itself as a difference in potential between the ends of a metal bar subjected to a temperature gradient $\nabla T$. In a circuit including two junctions between two materials A and B at temperatures $T_1$ and $T_2$, the resulting voltage is given by:

$$V = \int_{T_1}^{T_2} [S_B(T) - S_A(T)] dT \tag{1}$$

wherein: $S_A$ and $S_B$ are the Seebeck coefficients (also called thermoelectric power) related to two materials A and B. The voltage values are typically in the order of several μV/K. The Seebeck coefficient depends from the material, from absolute temperature and from morphological characteristics. The Seebeck effect can be exploited for measuring temperature in terms of voltage differences generated in a circuit comprising a junction of different materials (thermocouple) or for generating electrical energy by connecting in series a plurality of thermocouples (thermopile).

From a microscopic point of view, the charge carriers (electrons in metals, electrons and holes in semiconductors, ions in ionic conductors) will diffuse when one end of an elongated conductor is at a different temperature of the other end. The hotter carriers will diffuse towards the portion at lower temperature as far as causing different carrier densities in the cooler and hotter portions of the conductor. In an insulated system, equilibrium will be reached when by diffusion, heat will become uniformly distributed along the whole conductor. Redistribution of thermal energy due to the motion of charge carriers (thermal current) is obviously associated to an electric current which will nullify itself when the conductor temperature becomes uniform.

In a system wherein two junctions connected in a circuit are kept at a constant temperature difference, the thermal current will be constant too and therefore there will be a continuous flow of charge carriers in the circuit.

Mobility of the carriers is reduced by scattering phenomena at impurities, grain boundaries and similar defects present in the conducting material and by lattice vibrations (phonons). Therefore, the Seebeck effect is strongly dependent from density of impurities and crystallographic defects and from the phonon spectrum of the material.

Phonons move along the thermal gradient loosing energy by interacting with electrons or other carriers and with lattice imperfections, it is useful to define a thermoelectric factor of merit of a material as: $Z=S^2\sigma/\kappa$, where κ and σ are the thermal and electrical conductivities of the material, respectively.

From the technological point of view, the use of generators based upon the Seebeck effect is considered potentially interesting. More than half the heat produced in a thermal plant is usually dissipated as low enthalpy heat, it is estimated that about 15 millions of megawatts are wasted in the energy conversion processes. Availability of Seebeck generators, able to convert even only partially such a waste heat in electricity would be able to impact positively on the energy problem.

However, thermoelectric generators have an extremely low efficiency. For example, in case of a thin film of n silicon, doped with $5\times10^{15}$ As atoms per $cm^2$, the factor of merit, at room temperature, would be $Z\approx3\times10^{-5}$ $K^{-1}$; whereas values of $ZT\approx1$ can be obtained only with costly materials of limited availability such as $Bi_2Te_3$, Sb, Se and alloys thereof.

Practically, apart from some uses of high added value such as thermoelectric generation in space crafts, thermoelectric generators made with massive amounts of low cost materials of ample availability would achieve conversion yields of just about 7%. By comparison a turbine engine is able to convert about 20% of thermal energy in useful electrical current.

Recently it has been demonstrated [1, 2] that with a system based on an extremely slender conductor in the form of a silicon nanowire of about 20 nm and rugged outer surface, a high thermoelectric figure of merit can be achieved. The increased Z figure of the material derives from a decoupling of the free average paths of phonons and electrons caused by a different incidence of scattering at the surface of the two species. In particular, the important contribution to heat conductivity of acoustic phonons of lower frequency (of larger wavelength) is eliminated because the density of phonons of wavelength larger than the cross sectional size of the wire practically becomes null. Consequently, the heat conductivity of silicon drops from $\approx150$ W $m^{-1}$ $K^{-1}$ (at room temperature for massive Si) to 1.6 $Wm^{-1}$ $K^{-1}$ (at room temperature for 20 nm Si nanowires), whilst by contrast the electrical conductivity does not suffers an equivalent drastic decrement.

Formation of test nanowires of a suitable conductor or semiconductor material has for a long time been possible only with laboratory techniques hardly suited for fabricating thermo-electric conversion elements of commercially viable structure and size which could be associated for realizing septa of thermoelectric conversion, capable of functioning at commercially significative power levels and which could be industrially fabricated on a mass production scale.

A method of fabricating nanowires of elements of the IV Group of the Periodic Table or alloy thereof, without requiring advanced lithographic techniques, and including treatment steps for enhancing surface ruggedness, is disclosed in prior Italian patent application of one same applicant, filed on Apr. 11, 2008, published as WO 2009/12531. The method contemplates optional ion implantation and a thermo-cycling of the nanowires to induce creation of voids in the bulk of the material in order to usefully modify in a significantly different manner the mean free paths of phonons and electrons.

The prior application discloses the way a single level array of parallel nanowires and resultant structure may be fabricated in an industrially scalable manner, to be eventually stacked with similar single level array strictures in order to incrementally increase the size of the opposite surfaces, respectively hot and cold, of a septum of thermoelectric conversion, reduce internal electrical resistance and increase the power that can be yielded from the device.

The formation of a single level array of parallel nanowires on the surface of an insulating substrate by photolithographic definition, deposition of a conformal layer of conductor or semiconductor material and successive anisotropic etch of the conformal layer, requires the fabrication of innumerable of such "monolayer" elements, each through a repetition of the same sequence of photolithographic definition, deposition and etch, which makes the process relatively costly and limits the numerosity of nanowires that can be packed per unit of area of thermal input/output of a practical conversion device thus constituted.

OBJECTIVES AND SUMMARY OF THE INVENTION

A first objective of the inventors/applicants is to provide a structural element adapted to be modularly associated to other similar structural elements, having a dense population of nanowires of a conductor or a semiconductor material organized in a plurality of rows and columns of parallel nanowires supported on a single substrate achieving an outstandingly great numerosity of nanowires per unit of area of the element.

Another Objective is to provide an efficient fabrication process adapted to be conducted with common practices of planar processing technology and having a relatively simple and low cost process flow.

Another objective is to provide a septum for a Seebeck/Peltier thermoelectric conversion device of dimensions suitable for power applications, composed by an unlimited number of structural elements modularly associated, each having a plurality of rows and columns of parallel nanowires on a single substrate, with distinct metallizations of connection in parallel of groups of nanowires, of a certain fractional number of the whole population of nanowires, over opposite surfaces, respectively cold and hot, of the septum and metal lines or wires of connection in series of the groups of nanowires in parallel, to two terminals of the device.

These objectives are achieved by a novel and effective structure of a stackable element or more generally adapted to be associated modularly to other similar elements to form a septum of relatively large dimensions for a Seebeck/Peltier thermoelectric conversion device, fabricable with common planar processing techniques.

The structure basically consists or stack of alternated layers of dielectric material, adapted to be deposited in films of thickness lesser than or equal to about 50 nm, of low heat conductivity and which is etchable by a solution of a specific chemical compound, and of a second dielectric material of low heat conductivity that is not etched by the solution.

For the whole width, the stack is interrupted by parallel trenches the width of which may correspond to the minimum linewidth of definition allowed by the resolution of the lithographic process used for defining, the parallel trenches, but which may eventually be limited by other parameters, in primis the height of the stack to be subjected to the vertical etch to cut the stack in order to form the parallel trenches.

These trenches, produced by transversally cutting the stack, have over the opposite etch surfaces parallel cavities of "retreat" of the respective etch Front of the first dielectric material by the dissolving action of the etching solution, for an average in-depth of the etchings generally comprised between about 15 and about 35 nm.

Nanowire-like residues of conformally deposited sacrificial layer of conducting or semiconducting material of filling of the parallel cavities present on the opposite surfaces of the reaches, subsequently removed from substantially planar vertical and horizontal surfaces, constitute as many parallel nanowires generally of non uniform cross sectional area and highly irregular surfaces of a conductor of semiconductor filler material, organized in rows and columns across the slotted stack of alternated layers of different dielectric materials.

Therefore, though the element can be replicably fabricated in a planar technology, it comprises a two-dimension array of parallel nanowires, electrically insulated from one another, that extend from one side to the other side of the stack, organized in rows of spaced parallel nanowires laying on a same level plane and columns of nanowires, extending orthogonally to the level planes.

Numerosity of alternated layers of different dielectric materials of the stack over the surface of an insulating substrate is theoretically illimited and is practically limited only by the ability of making trenches with substantially vertical sidewalls in a stack of alternated layers of different dielectric material, up to a limit height of the stack which may reach several tens of microns ($\mu$m), in other words, the limit depth of slots that can be made with an acceptable geometry of the cross section of the parallel slots cut in the stack.

According to another aspect of the present disclosure, the novel fabrication process of a stackable element adapted to form a septum for a Seebeck/Peltier thermoelectric conversion device, comprises the steps of:

a) depositing a first layer of one or the other of a first dielectric material etchable by a solution of a chemical compound and depositable in film of thickness lesser of or equal to 50 nm and of a second dielectric material of low heat conductivity resistant to said etching solution, on a flat substrate of a dielectric material of low heat conductivity resistant to said etching solution;

b) depositing over said first layer of one of the two different dielectric materials a layer of the other dielectric material and repeating steps a) and b) for a number of times sufficient to reach a desired height of the stack of layers (a) alternated to layers b);

c) forming or applying a mask over the stack defining parallel etch lines of width equivalent to the minimum ling definable with the lithographic technique used, extending for the whole width of the stack and spaced by one or more micrometers ($\mu$m);

d) etching by sputtering, reactive plasma, or plasma through the opening of the mask the multilayer stack forming parallel trenches as deep as exposing the surface of the substrate;

e) etching with said solution the opposite etch surfaces of said etchable first dielectric material of thickness (generally not greater than about 50 nm) as far as retreat the etch surfaces between the adjacent layers of the second dielectric material (not etched by the solution), for an average distance of about 20 nm, forming parallel nanocavities over the opposite etch surfaces along each trench;

f) after having eliminated eventual residues of the mask, depositing under conditions of high conformity to the receiving surfaces a layer of conductor or semiconductor material having a relatively high intrinsic Seebeck coefficient, filling at least partially said parallel cavities as far as growing over vertical and horizontal planar surfaces a sacrificial conformal layer free of discontinuities;

g) forming anew or applying again said mask over the stack;

h) etching through the mask openings by sputtering, reactive plasma or plasma the conformally deposited sacrificial, layer of conductive or semiconducting material as far as completely removing it from vertical and horizontal surfaces, leaving residual nanowires of the conductor or semiconductor filler inside said parallel cavities.

The invention is defined in the annexed claims.

BRIEF DESCRIPTION OF THE DRAWINGS

The series from FIG. 2 to FIG. 6 illustrates with schematical cross sectional view of structural features of the element, fundamental steps of the fabrication process of the present disclosure.

EXEMPLARY EMBODIMENTS OF THE INVENTION

Embodiments of the claimed invention will now be described for purely illustrative purpose making reference to the attached drawings.

Numerosities and organization of the elements and electrical connections of the device, as well as the material used and related processing conditions may be differently set and chosen by the designer based on preferences and/or specific requirements of the application. Therefore, the invention is not intended to be limited to the exemplary embodiments herewith described and illustrated.

Figure 1:
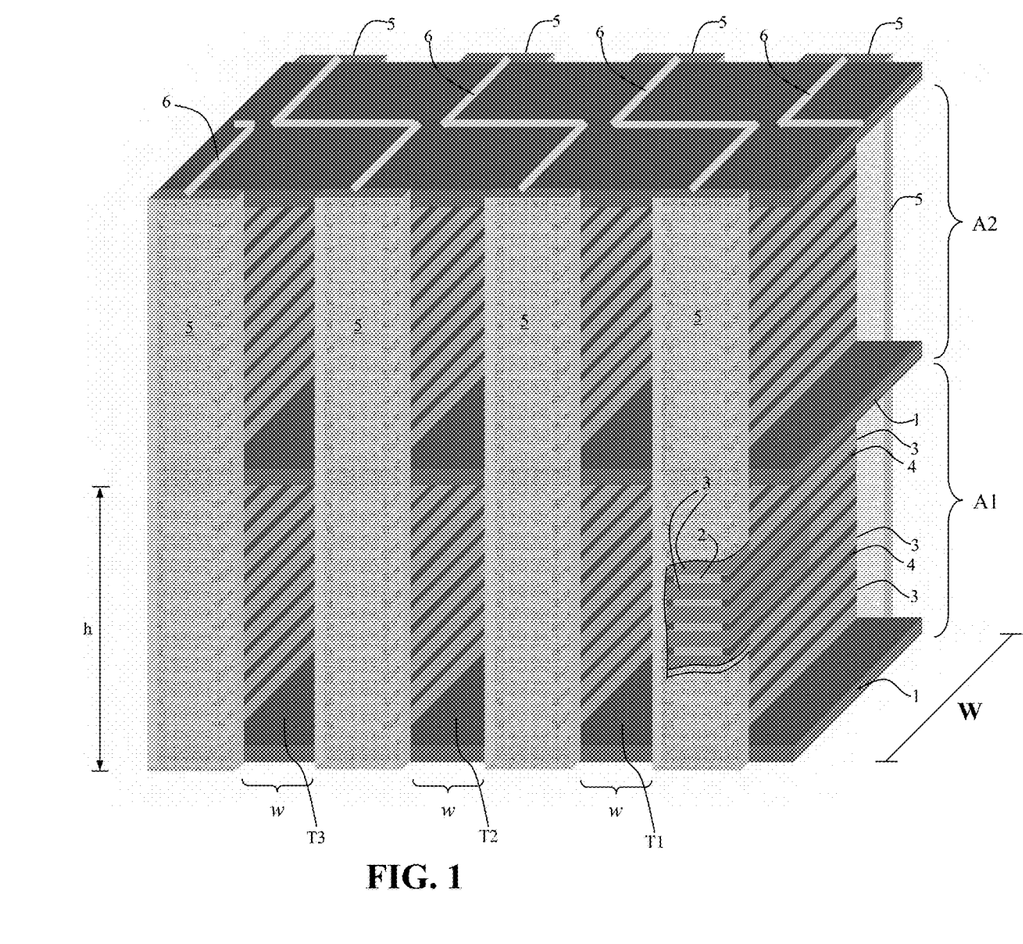
FIG. 1 shows the architecture of a septum for a Seebeck/Peltier thermoelectric conversion device composed of elements of the present disclosure, stacked and bonded together.

FIG. 1 shows the basic architecture of a septum for a Seebeck/Peltier thermoelectric conversion device, composed of elements of the present disclosure stacked and bonded together. The illustrated fragment is of two adjacent elements, A1 and A2, respectively, each composed of a flat substrate 1 of a dielectric material of low heat conductivity, resistant to the etching solutions and temperatures contemplated by the fabrication process of the element and to the temperatures of operation of the thermoelectric conversion device. Suitable substrate materials are thin sheets of glass, glass-ceramic, ceramic, sintered materials or cer-met of alumina, refractory oxides of metals of Groups IV B and V B of the Periodic Table of elements, mixed oxides and mixtures thereof, thermosetting resins, agglomerates and composites using epoxidic or phenolic binders and particles and/or fibers of nonconducting materials.

Over the substrate 1 there is a stack composed of layers of a first dielectric material 2 deposited in a film of thickness lesser than or equal to about 50 nm and etchable with a solution of a suitable chemical compound, alternated to layers 3 of a second dielectric material of low heat conductivity which is not etched by the solution.

The first dielectric material deposited in films 2 of thickness lesser than or equal to 50 nm, may be an oxide, for example $SiO_2$ or other dielectric oxide that can be deposited in highly conformal ultrathin films.

The second dielectric material 3 may be a nitride, for example $Si_3N_4$ or a refractory oxide, mixed oxide or other dielectric compound that is substantially not etched or in any case only lightly attacked by the etching solution of the first dielectric material.

The stack has parallel slots across the whole width W of the stack forming parallel trenches T1, T2, T3, . . . , extending along the whole width of the substrate 1. The width w of the trenches may correspond to the minimum linewidth that can be practically defined with the lithographic technique used and, by sing common photolithography, may generally be comprised between 150 nm and 1 μm, while the separation between adjacent trenches, corresponding to the width or thickness of the parallel walls or slices of multilayered stack that remains after producing the trenches, is the lesser possible compatibly with preservation of sufficient mechanical stability of the slender parallel walls during the steps of cutting the stack for creating the parallel trenches of wet etching of the etchable layers, of depositing a filler layer of conducting or semiconducting material, and of removing the deposited material from planar surfaces.

The stack may reach the height h theoretically illimited, being possible to increment the number of overlaid layers 2 and 3 and in practice is limited by the technological ability of producing parallel cuts of minimum width w and periodicity (pitch) through the whole thickness W of the stack, in order to maximize the density of nanowires per unit area, compatibly with the requirement of ensuring sufficient mechanical stability to the residual walls of stack between adjacent trenches during the etching step, a selective isotropic, wet etching of one of the two different dielectrics and subsequent step of filling the cavities and of removing the filler material from the planar surfaces of the structure.

By creating the parallel slots by anisotropic etch by sputtering, reactive plasma or plasma etching of the dielectric materials of the alternated layers 2 and 3 of the stack, using a definition mask of common photoresist, it is possible to perform cuts with substantially parallel (vertical) etch surface through thicknesses of the stack (height h) from several tens of μm as far as to few millimeters.

Of course, the greater is the height h of the stack, the greater will need to be the periodicity or pitch of replication of the parallel trenches, that is of the thickness of the residual parallel walls separating adjacent trenches. Normally, the height of the stack h and the periodicity (pitch) may be of the same order of magnitude.

Relative resistance to attack by a specific chemical solution of the dielectric material of the layers 3 compared to the dielectric material of layers 2 which dissolves at a certain rate in the solution, permits the formation of nanodimensioned parallel cavities along the exposed etch surfaces of each trench T1, T2, T3, . . . , Ti, . . . , because of a progressing, retreat of the respective etch front of the dielectric material of the thin layer 2 from the plane of the etch surface of the trench. Inside these parallel cavities remain nanowire like residues of a conductor or semiconductor filler material of a conformally deposited sacrificial layer filling the parallel nanocavities and which is subsequently removed by anisotropic etching from the substantially planar etch surfaces of the trenches. Such residues 4 constitute parallel nanowires of the filler material, perfectly organized in rows and columns.

The filler material constituting the residual nanowires 4 may be semiconductor such as silicon with natural isotopic presence or with art enriched presence of $^{29}$Si, intrinsic or doped with donor and/or acceptor atoms, a silicon-germanium alloy, eventually isotopically enriched with $^{29}$Si, intrinsic or doped with donor and/or acceptor atoms and equivalent semiconductor materials, a metal such as tungsten, titanium or alloys thereof, a metal alloy of semi-metals, an alloy between a metal and a semi-metal. The filler material may in any case be deposited in a substantially conformal manner, adapted to fill parallel nanocavities as those created in the opposite wall surfaces of each trench.

As shown in FIG. 1, elements thus constituted may be associated modularly together, for example by stacking one on the other and the parallel trench cavities of each element or of a complete septum constituted by joining together several elements, are filled with a dielectric material of extremely low heat conductivity such as for example an aerogel of silica or alumina or of other refractory oxide, adapted to contribute to constitute a thermally insulating septum having an overall (compounded) heat transmission coefficient as low as possible.

To this end, definition of the parallel trenches T1, T2, T3, of the single elements is designed in order to determine a fill/void ratio as low as possibly, compatibly with maintaining a sufficient mechanical stability of the residual parallel walls of multilayered stack, the thickness of which may be the minimum capable of ensuring, besides electrical separation between the nanowire on one side and the nanowire on the other side of the wall (at any level of the stack), also an adequate mechanical stability during the etching of the parallel cuts in the stack as well as during the removal of the conformally deposited conductor or semiconductor filler material of the nanocavities formed in the opposite surfaces of each trench.

This mechanical integrity requirement and insulating characteristics of the septum must not on the other end penalize beyond measure maximization of the number of nanowires per unit area of opposite surfaces of the septum at which terminate the opposite ends of all the parallel nanowires, in order to provide for an adequate cross section of electrical current conduction for limiting the internal resistance of the thermoelectric converter.

The architecture of the elements of the present disclosure and of a thermoelectric conversion septum of relative large size composable with a plurality of elements, has no particular criticalness. The defectivity that may be represented by single interrupted nanowires (in a stochastically determined percentage) therefore not functioning, remains of relatively little significance by virtue of the vast number of nanowires that are eventually grouped together by connecting them electrically in parallel with surface metallization islands over the opposite sides of the septum.

Figure 7:
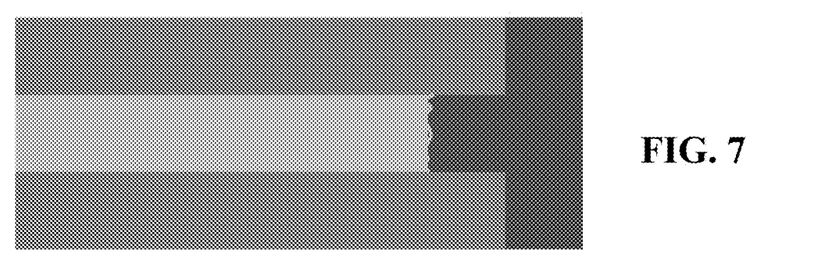
FIG. 7 and FIG. 8 show few possible transversal cross sectional sample views of residues of the filler of the nanocavities that constitute the single nanowires of conductor or semiconductor material of the multilevel structure of the element of the present disclosure.
Figure 8:
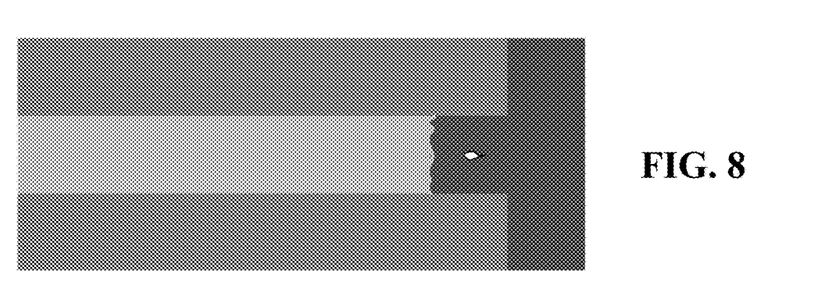

Irregularity of retreat of the etch surface of the thin dielectric layers 2, typical of a wet chemical etching by contact with a solution (e.g. by immersion in the each solution) and irregularity of filling of the parallel nanocavities concur to the result that the residual nanowires 4 of conductor or semiconductor filler material generally have a varying cross section along their length, each single nanowire, that is markedly varying in size and in terms of perimetral profile, as schematically depicted in the detail of FIG. 7. Moreover, within each nanowire are frequently present inner voids and/or cracks, as schematically depicted in the detail of FIG. 8. All these irregularities enhance surface scattering phenomena of phonons along their propagation in the direction of heat transfer across the composite septum.

These advantageous characteristics of the parallel nanowires 4 of the element of the present disclosure produce a remarkable increase of the Seebeck coefficient compared to nanowires of the same filler material, substantially compact, having a relatively uniform cross section and a relatively smooth surface, like those made according to the technique described in the above-identified prior patent application.

After having completed the stack and formed the residual nanowires, the trench voids may be completely filled with a material having an extremely low heat transmission coefficient, for example an aerogel of silica or other insulating material, in order to consolidate the mechanical stability of the so formed nanostructures and making the elements more easily handled when assembling (stacking) them together for forming a septum of the desired size.

Alternatively, the association/stacking of the fabricated elements may take place before proceeding to fill the trench voids of the composite article (septum) with the insulating material (aerogel).

As schematically depicted in FIG. 1, metallization strips 5 may be defined over opposite surfaces of the septum at which terminate the ends of every single nanowire 4, in order to connect electrically in parallel per groups the nanowires 4, as depicted in the figure.

Constitution of a device of thermoelectric conversion by Seebeck/Peltier effect, is completed by realizing electrical connections 6 among the defined metallization islands over the opposite surfaces of thermal input/output of the septum, in order to connect electrically in series the groups of nanowires 4 in parallel, to two terminals of the whole series/parallel network of nanowires 4 of the septum.

These metallizations on opposite surfaces of a composite septum made by a plurality of elements may be defined below cost print techniques (e.g. by serigraphy or ink jet printing) for defining the desired patterns of the metallic layer. Alternatively, the opposite surfaces of each element fabricated with techniques of planar fabrication processing may be already coated with a common metal layer deposited, after having suitably slanted the opposite surfaces to be metallized of the element to be no longer vertical but inclined, by carrying out a succession of selective etchings of the two different dielectric materials. The etch steps may be repeated, each for a preestablished interval of time, enhancing a first and a second chemical compound, for successively etching the different dielectrics. Thereafter, it will be possible to planarly deposit and eventually photolithographically define a metal layer.

Elements thus made, for example with all the nanowires of the element preconnected electrically in parallel by an unpatterned metal layer deposited on the opposite surfaces of the stack, with contact resistance effectively minimized because of the increased contact area with the ends of single nanowires due to the slanting of the end surfaces carried out through sequential etchings of the dielectrics on the opposite surfaces prior to depositing the metal layer, as well as because of the refined metallization techniques of modern planar fabrication processing, may be joined together to form blocks of a certain number of elements, all nanowires of which are preconnected in parallel and eventually connectable according to a desired series-parallel scheme, by a further metal layer (which may be of a different metal, for example a low melting alloy, applied by dipping the surface of the septum in the molten alloy) formed over the premetallized surfaces of the planarly fabricated elements. Such a metal overlayer may than be defined according to a desired series-parallel electrical connection scheme of the whole population of nanowires of a septum thus constituted.

The numerosity of nanowires per unit area of thermal input/output of the septum of the present disclosure is at least three orders of magnitude greater than that obtainable in a septum according to the closest prior art disclosed in the cited prior patent application published also as WO 2009/1255317-A2. The maximum numerosity in a septum of the prior technique is of $5\times10^6$ cm$^{-2}$, whilst in a septum according to the present disclosure, it may reach $1.5\times10^{10}$ cm$^{-2}$.

The element of the present disclosure can be fabricated in a particularly efficient manner in terms of relative simplicity of the process flow, substantial absence of criticalnesses and low cost, with a process, an embodiment of which will now be described making reference to the series of drawings from FIG. 2 to FIG. 6, which show schematically an enlarged detail (dimensionally not in scale) of a cross section of the element being fabricated, in correspondence of one of the many parallel trenches.

Figure 2:
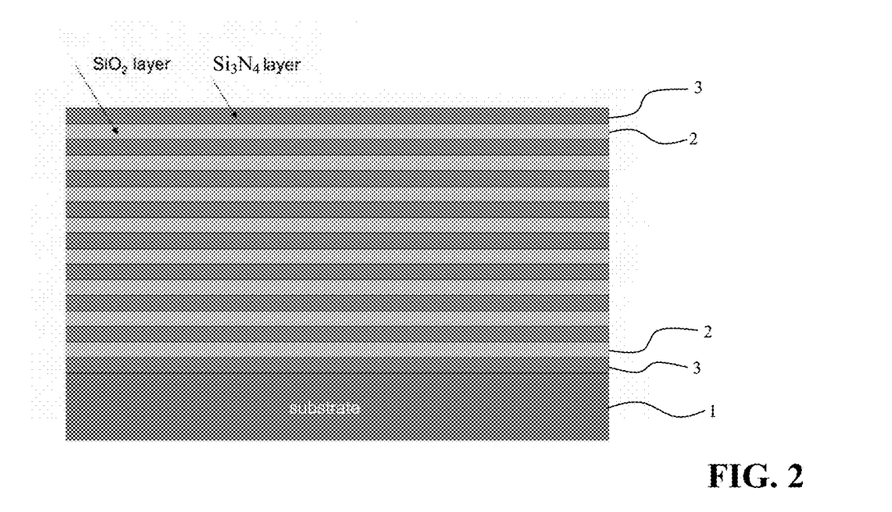

With reference to FIG. 2, the fabrication process and in particular the step of forming the multilayered stack of alternated layers 3, 2, 3, 2, . . . , of different dielectric materials, resistant to and etched, respectively, by specific etching solution, over a substrate, for example a thin sheet of a glass-ceramic material 1, may be efficiently carried out in an apparatus of chemical deposition from vapor phase, suitably equipped and able to permit the performance of a succession of deposition steps of alternated dielectric layers of different material within the am reactor, modifying every time the conditions of deposition and the gaseous precursors introduced in the reactor.

Referring to the exemplary case depicted in the series of figures, the first layer deposited over the surface of the substrate 1 may be a layer of silicon nitride 3 of average thickness of about 40 nm or of about 100 nm or more, depending on the fact that it be the material to be etched or the material resistant to etching.

Conditions of deposition of silicon nitride (in the example the layers 3) may contemplate:
  deposition temperature of about 790° C.±200° C.
  pressure of about 170 mTorr±100 mTorr
  atmosphere: di-chlorosilane or other chlorosilanes or mixtures thereof in presence of nitrogen and/or ammonia.

Having further established the time of deposition for obtaining the desired thickness of silicon nitride of the layers 3, the atmosphere and the deposition conditions are changed, carrying out common fluxing steps and subsequent constitution of the correct atmosphere for carrying out the deposition of the successive layer of a different dielectric material 2, for example of silicon oxide and carrying out the deposition of the layer 2 at conditions that may be:
  deposition temperature of about 950° C.±150° C.
  pressure of about 200 Torr±150 Torr
  atmosphere: di-chlorosilane and oxygen, optionally in presence of water or nitrogen as diluent.

Once the preestablished deposition time for obtaining the desired thickness of the layer 2 of silicon oxide, of about 40 nm or of about 100 nm or more of thickness, depending on the fact that it be the material to be etched or the material resistant to etching, has elapsed, within the reactor are again re-established the conditions of deposition of the nitride for depositing a successive layer of silicon nitride over the layer of silicon oxide and so forth growing a stack of alternated layers of silicon nitride 3 and of silicon oxide 2 for a height of the stack that may reach up to several millimeters.

Figure 3:
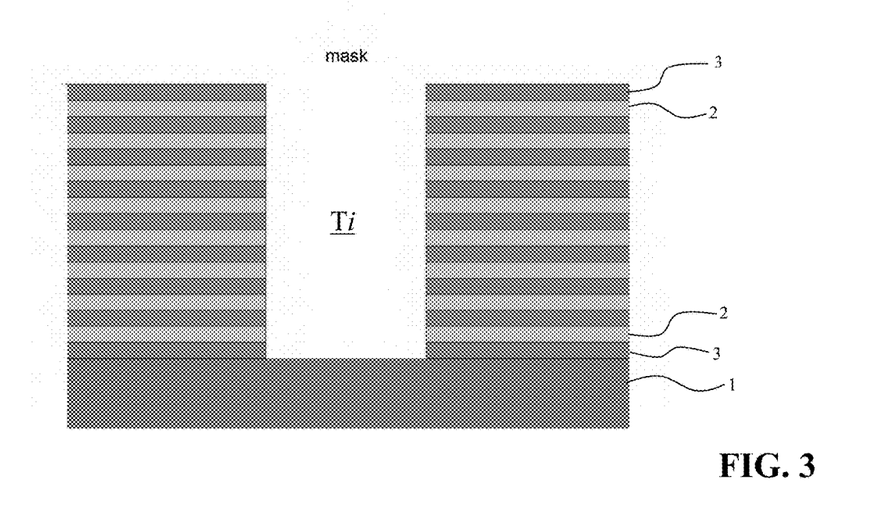

With reference to FIG. 3, through a common photolithographic mask of definition of parallel trenches Ti, the alternated layers of silicon nitride and silicon oxide are anisotropically etched by plasma, reactive plasma or sputtering, as far as completely "slicing" the stack, exposing the surface of the substrate 1 at the bottom of each trench. Generally, the etching may be conducted with any of the commonly used techniques employed in planar processing of multi layered stacks.

Figure 4:
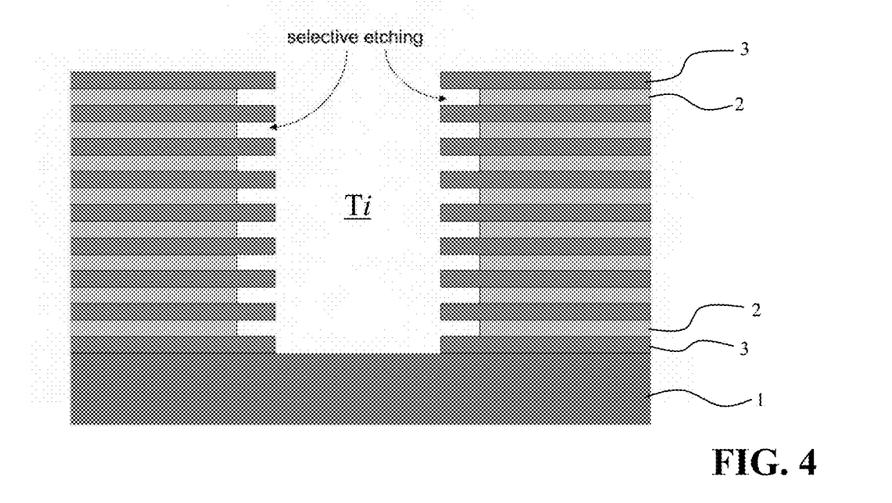

After having made the parallel slots across the stack of alternated layers of silicon nitride and silicon oxide on the substrate 1, the dielectric material of the layers 2 (in the example of silicon oxide is subjected to isotropic wet etching in an aqueous solution of hydrofluoric acid, progressively causing by dissolution of the oxide, a retreat of the etch surface of the layers 2 from the plane of the opposite surfaces of definition of the trenches as depicted schematically in FIG. 4.

Of course, as will be evident to the reader knowledgeable of silicon processing techniques, in the specific exemplary embodiment of alternated layers of silicon oxide and of silicon nitride, the dielectric material that is etchable with a specific solution for progressively retreat the etched surface may alternatively be the silicon nitride, using in this case as selective etching solution of the nitride in respect to the oxide, a phosphoric acid melt ($H_3PO_4$) or, alternatively a hot aqueous solution of phosphoric acid.

Figure 5:
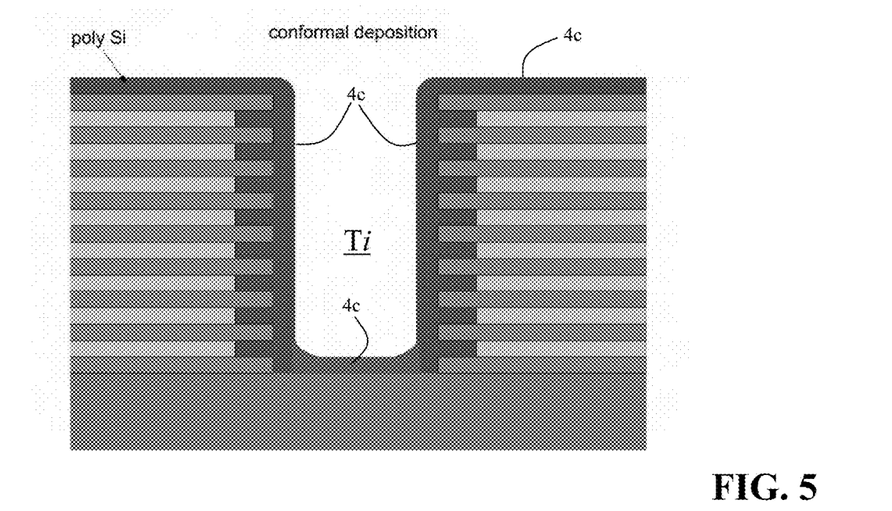

After having removed residues of the definition mask of the parallel trenches, rinsed and dried the article of manufacture, a sacrificial layer 4c of a conductor or semiconductor material 4c is conformally deposited such to fill the nanometric cavities produced over the opposite surfaces of the trenches by the retreat of the layers 2 of dielectric material deposited with an average thickness of about 40 nm and successively etched between the dielectric layers 3 unaffected by the etching solution, which may have a layer average thickness, for example of about 100 nm.

This deposition step of the sacrificial conformally deposited layer of material thermo-electrically active is schematically depicted in FIG. 5.

In the exemplary embodiment, the deposited thermo-electrically active material may be silicon deposited under conditions of high conformity for example, at the following deposition conditions:
  temperature of about 610° C.±200° C.
  pressure of about 170 mTorr
  atmosphere: silane, optionally in presence of chlorosilanes and $H_2$ or $N_2$ as diluent.

With reference to FIG. 2, the sacrificial filler layer 4c is subjected to unmasked anisotropic etching for example by reactive ion etching (RIE) as far as completely removing the deposited material of the conformally deposited layer 4c from the horizontal and vertical planar surfaces leaving residues of the filler material within the nanocavities purposely produced on the opposite surfaces of the parallel trenches Ti. These residues of filler material constitute as many nanowires 4 parallel to each other, electrically insulated from one another, organized in rows (on level planes of the stack) and in columns, as may be observed in FIG. 6.

Figure 6:
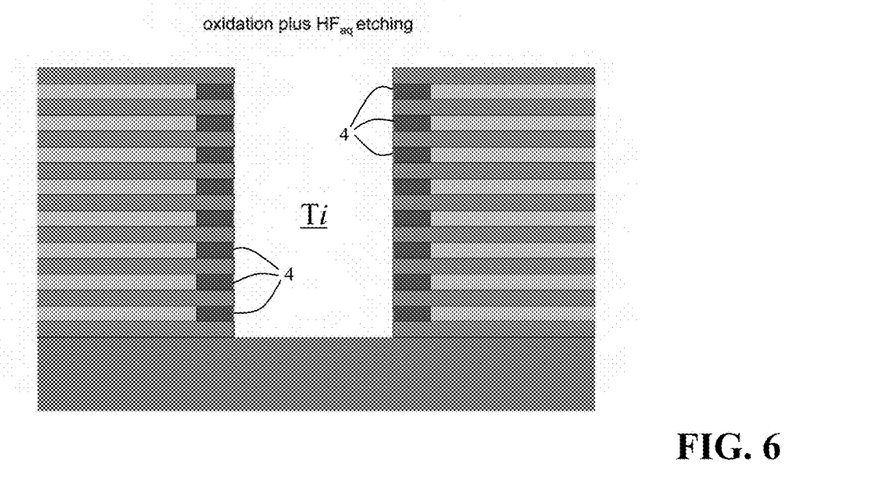

The nanowires 4 extend from one side to the other of the trench.

The conditions of formation of the nanocavities by selective isotropic etching of one of the two different dielectric materials used for forming the stack of alternate layers, as well as the conditions of filling of the parallel nanocavities by the conformally deposited thermo-electrically active material, are processes, the progression and completion of which are intrinsically irregular, being in the first case affected by crystallographic and morphological differences of the deposited dielectric material of the layers being etched and in the second case affected by similar irregularities of retreat of the etch front of the dielectric material being selectively etched isotropically by contact with an etching solution or melt.

The combined result of these factors is such to determine the formation of wire like residues of the material of the conformally deposited sacrificial layer with a disuniform cross section along the extension of the single nanowire, that is of varying dimensions and perimetral profile, as well as an outer surface morphologically rugged and irregular, as schematically depicted in the detail of FIG. 7.

Moreover, the filling process by the thermo-electrically active material, though deposited under conditions of high conformity to the receiving surface morphology, progresses in a way that leads to the formation of cracks and inner voids 10 (because of edge effects), as schematically depicted in the detail of FIG. 8.

These intrinsic morphological and geometrical characteristics of the nanowires left inside the nanocavities strongly favor surface scattering of phonons. This is compounded in a sensible increase of the observed Seebeck coefficient compared to differently fabricated nanowires of the same material but with a diameter or with cross sectional dimensions relatively constant, substantially compact and having a relatively smooth outer surface.

BIBLIOGRAPHY

A. I. Hochbaum, R. K. Chen, R. D. Delgado, W. J. Liang, E. C. Garnett, M. Najarian, A. Majumdar, and P. D. Yang, 'Enhanced thermoelectric performance of rough silicon nanowires', Nature, 2008, 451(7175), p. 163-167.

A. I. Boukai, Y. Bunimovich, J. Tahir-Kheli, J.-K. Yu, W. A. Goddard Iii, and J. R. Heath, 'Silicon nanowires as efficient thermoelectric materials', Nature, 2008, 451 (7175). p. 168-171.

The invention claimed is:

1. A Seebeck/Peltier thermo-electric conversion device, comprising at least one element that can be fabricated with planar processing techniques, modularly associable to other similar elements for constituting a septum for the Seebeck/Peltier thermo-electric conversion device, comprising a stack of width (W) corresponding to the thickness of the septum and a length (L) corresponding to a dimension or fraction of a dimension of a surface area of the septum, the at least one element having a population of nanowires (4) of semiconductor material of high Seebeck coefficient, parallel and insulated from one another extending across the width (W) of the stack, organized in rows and columns, said stack comprising:
  a) alternated layers of a first dielectric material (2) deposited in continuous film of thickness lesser than or equal to 50 nm, etched by a solution of a specific chemical compound, and of a second dielectric material (3) of low heat conductivity not etched by said solution;
  b) parallel trenches having a lower limit of width (w) of which corresponds to a minimum linewidth of lithographic definition, spaced by at least 1 µm;
  c) parallel nanocavities of retreat of an etch front of the layers of said first dielectric material by said etching solution, along opposite surfaces of each of the parallel trenches;
  d) wirelike nanodimensioned residues of said semiconductor material that fills said parallel nanocavities constitutes said population of nanowires (4) organized in rows and columns, said population of nanowires being fully inside said parallel nanocavities between layers of said second dielectric material and being electrically and thermally insulated from one another by interposed layers of the second dielectric material,
  wherein said semiconductor material of high Seebeck coefficient belongs to the group composed of monocrystalline or polycrystalline silicon with natural isotopic presence or enhanced presence of $^{29}$Si, intrinsic or doped with donor and/or acceptor atoms, and of a silicon-germanium alloy with natural isotopic presence or enhanced presence of $^{29}$Si, either intrinsic or doped with donor and/or acceptor atoms.

2. The Seebeck/Peltier thermo-electric conversion device of claim 1, wherein said first dielectric material (2) is $SiO_2$ and said second dielectric material (3) is $Si_3N_4$.

3. The Seebeck/Peltier thermo-electric conversion device of claim 1, wherein said population of nanowires (4) have disuniform cross section along their longitudinal extension and morphologically rugged outer surface.

4. The Seebeck/Peltier thermo-electric conversion device of claim 1, characterized in that the stack has a surface density of nanowires (4) less than or equal to $5\times10^{10}$ nanowires/cm$^2$, said population of nanowires having an average cross section of about 40 nm×20 nm normal to the heat input/output direction.

5. The Seebeck/Peltier thermo-electric conversion device of claim 1, wherein the height (h) of the stack and the periodicity or pitch of replication of said parallel trenches are of the same order of magnitude.

6. The Seebeck/Peltier thermo-electric conversion device of claim 1, wherein the population of nanowires are mechanically locked into the parallel nanocavities.

* * * * *